(12) United States Patent  
Koushan et al.

(10) Patent No.: US 9,025,396 B1  
(45) Date of Patent: May 5, 2015

(54) PRE-CONDITIONING CIRCUITS AND METHODS FOR PROGRAMMABLE IMPEDANCE ELEMENTS IN MEMORY DEVICES

(71) Applicant: Adesto Technologies Corporation, Sunnyvale, CA (US)

(72) Inventors: Foroozan Sarah Koushan, San Jose, CA (US); Deepak Kamalanathan, Santa Clara, CA (US); Juan Pablo Saenz Echeverry, Mountain View, CA (US); Venkatesh P. Gopinath, Fremont, CA (US); Janet Wang, Los Altos, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 39 days.

(21) Appl. No.: 13/763,461

(22) Filed: Feb. 8, 2013

Related U.S. Application Data

(60) Provisional application No. 61/596,671, filed on Feb. 8, 2012.

(51) Int. Cl.  
*G11C 7/00* (2006.01)  
*G11C 13/00* (2006.01)

(52) U.S. Cl.  
CPC ................................. *G11C 13/0069* (2013.01)

(58) Field of Classification Search  
CPC .................................................... G11C 13/0069  
USPC ............................................. 365/148, 189.16  
See application file for complete search history.

(56) References Cited

U.S. PATENT DOCUMENTS

| | | | | |
|---|---|---|---|---|
| 7,215,568 | B2* | 5/2007 | Liaw et al. | 365/148 |
| 7,558,099 | B2* | 7/2009 | Morimoto | 365/148 |
| 7,944,728 | B2* | 5/2011 | Nian et al. | 365/148 |
| 8,400,815 | B2* | 3/2013 | Terada et al. | 365/148 |
| 8,547,725 | B2* | 10/2013 | Kumar et al. | 365/148 |
| 8,659,931 | B1* | 2/2014 | Ertosun | 365/148 |
| 2013/0170283 | A1* | 7/2013 | Lan et al. | 365/148 |

* cited by examiner

*Primary Examiner* — Viet Q Nguyen

(57) ABSTRACT

A memory device can include a plurality of programmable impedance elements programmable between a low impedance state in response to a program voltage and a higher impedance state in response to an erase voltage having a different polarity than the program voltage; a programming circuit configured to apply the program and erase voltages to selected elements; and a pre-condition path configured to apply a pre-condition voltage only of the erase voltage polarity to fresh elements in a pre-condition operation; wherein fresh elements are elements that have not been subject to any programming voltages. The pre-condition electrical conditions can also include high voltage low current conditions that apply a greater magnitude voltage and smaller current than the first or second electrical conditions, or high voltage low current conditions that apply a greater magnitude voltage and greater current than the first or second electrical conditions.

28 Claims, 16 Drawing Sheets

2200

FABRICATE MEMORY DEVICE THAT PROGRAMS ELEMENTS HAVING ION CONDUCTOR MATERIAL BETWEEN TWO ELECTRODES WITH STANDARD ERASE OPERATION THAT APPLIES A 1st POLARITY VOLTAGE TO ELEMENTS AND STANDARD PROGRAM OPERATION THAT APPLIES A 2nd POLARITY VOLTAGE TO ELEMENTS  
2202

PRE-CONDITION FRESH ELEMENTS BY APPLYING VOLTAGE OF 1st POLARITY BUT LOWER VOLTAGE AND/OR CURRENT THAN STANDARD ERASE OPERATION  
2204

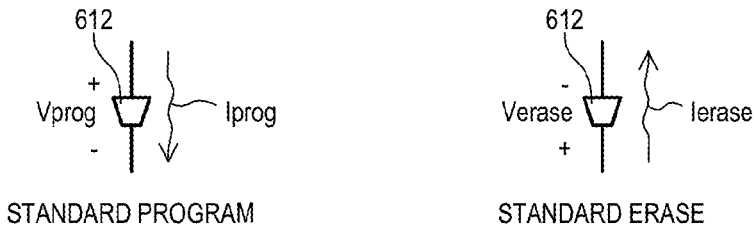
FIG. 6 (BACKGROUND)
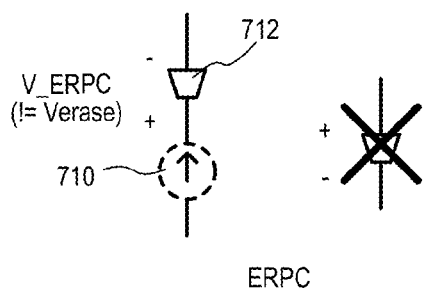
FIG. 7
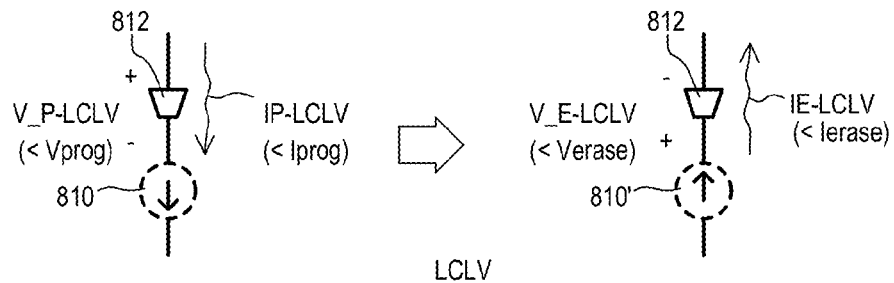
FIG. 8
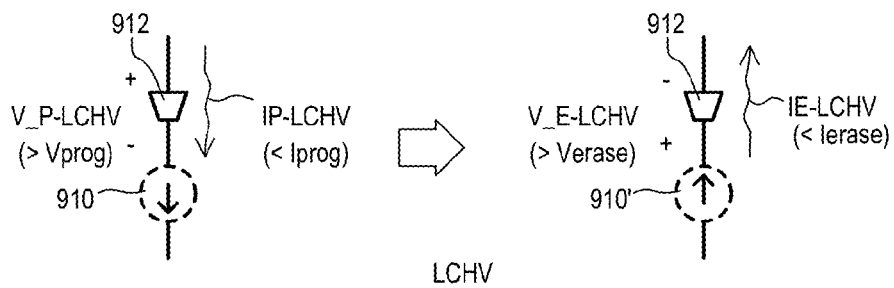
FIG. 9

PRE-CONDITIONING CIRCUITS AND METHODS FOR PROGRAMMABLE IMPEDANCE ELEMENTS IN MEMORY DEVICES

This application claims the benefit of U.S. provisional patent application Ser. No. 61/596,671, filed on Feb. 8, 2012, the contents of which are incorporated by reference herein.

TECHNICAL FIELD

The present disclosure relates generally to memory devices with programmable impedance elements, and pre-conditioning conditions applied to such elements in the "fresh" state (i.e., before the elements are programmed for a first time).

BACKGROUND

Programmable impedance elements, such as conductive bridging random access memory (CBRAM) devices can include elements that can be placed into a low resistance state with a programming operation, and a high resistance state with an erase operation. Conventionally, after a CBRAM device has been fabricated, but before it is programmed or erased to store data for the very first time (i.e., the CBRAM elements are "fresh" elements), the CBRAM device is subject to a "forming" step.

Conventionally, a forming step can apply the same electrical conditions as those used to program and erase the CBRAM elements in normal operations. For example, a conventional forming step can subject CBRAM cells to one or more cycles of programming and erase. Following the forming step, the CBRAM elements can be programmed and erased in the standard manner to store data values.

BRIEF DESCRIPTION OF THE DRAWINGS

FIG. 6 is a diagram showing conventional programming and erase of a particular element type.

FIG. 7 is a diagram showing an ERPC operation according to an embodiment.

FIG. 8 is a diagram showing an LCLV pre-conditioning operation according to an embodiment.

FIG. 9 is a diagram showing an LCHV pre-conditioning operation according to an embodiment.

FIGS. 12B-0/1 are diagrams showing ramped voltage pre-conditioning according to further embodiments.

DETAILED DESCRIPTION

Figure 1:
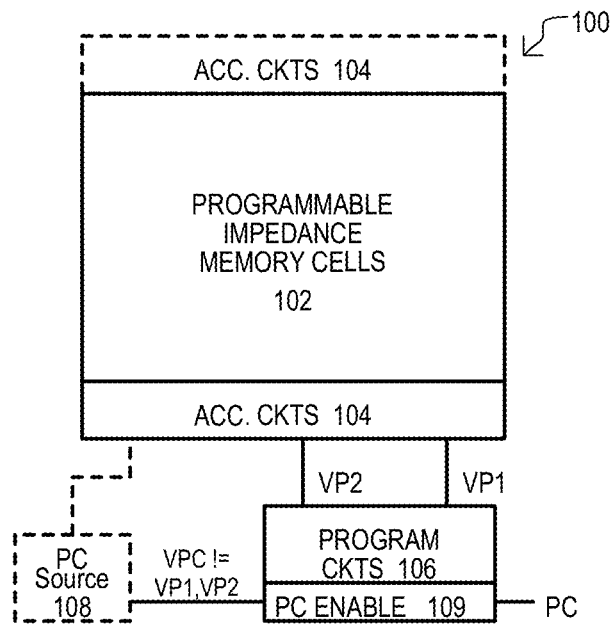
FIG. 1 is a block schematic diagram of a memory device according to one embodiment.

Embodiments described herein show methods of applying electrical conditions to "fresh" memory elements that differ from conventional forming steps. The application of such conditions is referred to herein as the pre-conditioning of fresh memory elements.

In the various embodiments, like features may be referred to by the same reference character but with a first characters corresponding to the figure number.

FIG. 1 is a block schematic diagram of a memory device 100 according to an embodiment. A memory device 100 can pre-condition memory elements with electrical conditions different from those used to program the memory elements.

A memory device 100 can include programmable impedance memory cells 102, access circuits 104, program circuits 106, and a pre-condition source 108. Programmable impedance memory cells 102 can include a number of memory cells arranged into one or more arrays, each memory cell having one or more elements programmable between different impedance states by application of electrical conditions.

Access circuits 104 can provide electrical paths to memory cells 102 that can enable elements in a "fresh" state (i.e., the elements have never been programmed into any particular impedance state) to be pre-conditioned. Further, access circuits 104 can provide electrical paths to memory cells 102 to enable standard programming operations (i.e., operations that program elements to particular impedance states for data storage). In some embodiments, access circuits 104 can provide the same paths for both standard programming and pre-conditioning. However, in other embodiments, access circuits 104 can include separate sections for standard programming and pre-conditioning. It is understood that in some embodiments access circuits devices 104 can be situated on multiple sides of memory cells 102. In very particular embodiments, access circuits 104 can be positioned on opposing sides of bit lines to enable voltages to be applied across programmable elements.

It is noted that in some embodiments, access circuits 104 can enable pre-conditioning of memory cells 102 in large numbers. In some embodiments, pre-condition operations can access more memory cells 102 than standard programming and/or erase operations. In particular embodiments, access circuits 104 can enable "mass" pre-conditioning to occur on all, or large sections of memory cells 102. In embodiments that may access memory cells 102 via word lines and/or bit lines, access circuits 104 can drive such bit lines and/or word lines simultaneously to enable pre-conditioning of groups of memory cells 102 in a single operation.

Program circuits 106 can provide programming voltages (VP1, VP2) that can enable elements to be programmed between different impedance states. In some embodiments, one programming voltage can be positive, while another is negative. In a very particular embodiment, elements can include a solid ion conductor programmable to a low resistance state by a positive voltage (i.e., VP1 is positive) and erasable to a high resistance by a negative voltage (i.e., VP2 is negative).

In some embodiments, program circuits 106 can generate one or more programming voltages (VP1, VP2) from received power supply voltages. Further, one or more of programming voltages (VP1, VP2) can have a magnitude greater than a supply voltage. In such embodiments, program circuits 106 can include charge pumps circuits, or the like, for generating higher than supply voltages. In addition or alternatively, one or more programming voltages (VP1, VP2) can have a magnitude less than a supply voltage. In such embodiments, program circuits 106 can include step down voltage regulators, or the like, to generate lower than supply voltages.

In other embodiments, program circuits 106 can receive one or more programming voltages (VP1, VP2) from an external source. In one particular embodiment, program circuits 106 can receive one or more programming voltages on an external connection to the memory device (i.e., package pin, pad, lead, trace, etc.).

A pre-condition source 108 can provide one or more pre-condition voltages (one shown as VPC) to fresh memory elements within memory cells, to pre-condition such memory elements. A pre-condition source 108 can establish electrical conditions across memory elements that are different than those applied during any of the programming operations (i.e., those established by program circuits 106). FIG. 1 shows an embodiment in which a pre-conditioning voltage can be different from any of those provided by program circuits (i.e., VPC !=VP1 or VP2).

In the embodiment shown, a pre-condition (PC) enable circuit block 109 can enable pre-condition voltages to be applied to fresh elements through program circuits 106. A PC enable block 109 can be enabled according to a mode input "PC". Accordingly, in response to mode input PC being active, pre-condition voltages can be applied to fresh element by operation of PC enable block 109. In a particular embodiment, PC enable block 109 can be configured to apply pre-condition voltages according to a predetermined algorithm.

In other embodiments, pre-condition voltages can be applied to fresh elements via paths different from standard programming paths.

It is understood that while FIG. 1 shows one pre-conditioning voltage (VPC), a memory device 100 can provide more than one pre-conditioning voltage to fresh memory elements in a pre-conditioning operation. In one embodiment, a pre-conditioning source 108 can provide pre-conditioning voltages of different polarities, and a pre-condition operation can apply both such voltages in a predetermined sequence during a pre-conditioning operation. However, in other embodiments, a pre-condition voltage can have but one polarity.

As in the case of program circuits 106, a pre-conditioning source 108 can generate pre-condition voltage(s) from received power supply voltages, or can receive such voltages from an external source.

In some embodiments, a pre-conditioning source 108 can also include pulse-generating circuits and/or for applying voltage pulses to fresh memory elements in a pre-conditioning operation. Such pulse-generating circuits can control a number of pulses, duration of pulses, and in some embodiments, a shape of voltage pulses. However, in other embodiments, generation and application of pre-condition pulses can be accomplished all, or in part, with access circuits 104.

As indicated by the dashed lines, all or a portion of pre-conditioning source 108 may, or may not be part of a memory device 100. In some embodiments, pre-conditioning source 108 can include circuits external to a memory device 100. In one embodiment, pre-conditioning source 108 can include an automatic test equipment (ATE) device that executes pre-conditioning operations on memory device 100. However, in other embodiments, a pre-conditioning source 108 can include circuits built into memory device 100 that execute pre-conditioning sequences in response to a command or an initial power-up of the device, as but two of many possible examples.

In this way, in a pre-conditioning operation, a pre-conditioning source can provide voltages to fresh memory elements that differ from those applied during standard programming operations.

Figure 2:
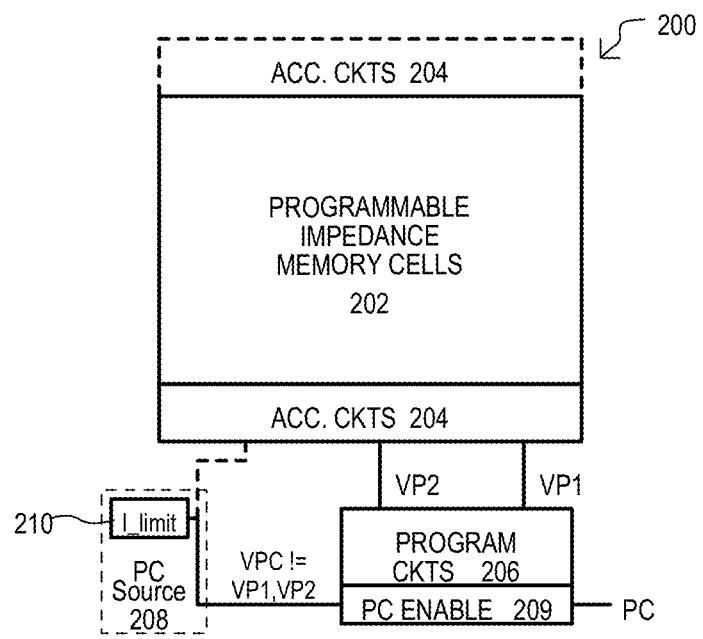
FIG. 2 is a block schematic diagram of a memory device according to another embodiment.

FIG. 2 is a blocks schematic diagram of a memory device 200 according to another embodiment. A memory device 200 can include sections like those of FIG. 1, and such like sections can have the same or equivalent structures and/or functions to those shown in FIG. 1.

Memory device 200 can differ from that of FIG. 1 in that a pre-conditioning source 208 can include a current limiting circuit 210. A current limiting circuit 210 can limit a current applied to memory elements during a pre-conditioning operation. In particular embodiments, during a pre-conditioning operation, a current can only be less than that applied to the elements by program circuits 206. It is understood, that in some embodiments, current limiting during a pre-conditioning operation can also be provided by access circuits 104.

Current limiting can occur on a per element basis (i.e., a current through an individual element during pre-conditioning is less than in standard programming/erase operation), or on a group basis (i.e., a current through a group of elements during pre-conditioning is less than current through a same number of elements during standard programming/erase operation).

In this way, in a pre-conditioning operation, a pre-conditioning source can provide currents to fresh memory elements that differ from those applied during standard programming operations.

While embodiments can include memory devices having elements with various structures, particular embodiments can be directed to memory devices having conductive bridging random access memory (CBRAM) like memory elements. CBRAM elements can be two terminal elements having an ion conducting material formed between a first terminal (an anode electrode) and a second terminal (a cathode electrode). An anode electrode can include one or more metals that are ion conductible within the ion conducting material.

Particular embodiments directed to CBRAM like memory elements will now be described.

Figure 3:
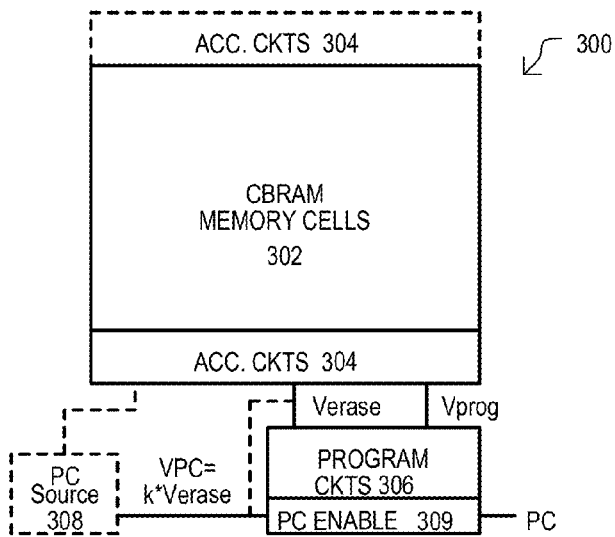
FIG. 3 is a block schematic diagram of a memory device having erase only pre-conditioning (ERPC) according to an embodiment.

FIG. 3 shows a memory device 300 according to another embodiment. A memory device 300 can include sections like those of FIG. 1, and such like sections can have the same or equivalent structures and/or functions to those shown in FIG. 1.

Memory device 300 can differ from that of FIG. 1 in that programmable impedance memory cells 302 can include CBRAM type elements. Standard programming of CBRAM type elements can include programming, which applies a positive programming voltage (Vprog) to place an element into a low resistance state, and erasing, which applies a negative erase voltage (Verase) to place an element into a high resistance state (polarities of voltages being taken from anode to cathode). Accordingly, in standard programming operations, program circuit 306 can apply voltages Vprog and Verase to selected memory cells to program them between high and low resistance states.

In the particular embodiment of FIG. 3, a memory device 300 can have an "Erase Only" pre-conditioning (ERPC). In an ERPC operation, a voltage having an erase polarity (e.g., negative when taken from anode to cathode) can be applied to memory elements in a pre-conditioning operation. Voltages of the programming polarity (e.g., positive when taken from anode to cathode) are not applied in the pre-conditioning operation. Accordingly, unlike a conventional CBRAM pre-conditioning, which can cycle through both program and erase operations, a memory device 300 may undergo pre-conditioning with voltages only of the erase polarity. As a resulting, preconditioning can be faster than a conventional pre-conditioning, and may have better results.

In the embodiment shown, a pre-conditioning source 308 provides a pre-conditioning voltage VPC=k*Verase. While VPC is the same polarity as Verase, in some embodiments, VPC can have: a smaller magnitude than Verase (i.e., k<1), a greater magnitude than Verase (k>1), or may be the same as Verase (k=1). Further, VPC may differ from standard erase operations by having pulses of a longer duration, or a shorter duration than a conventional erase operation.

In this way, in a pre-conditioning operation, a pre-conditioning source can provide erase only voltage polarities to fresh CBRAM type memory elements.

Figure 4:
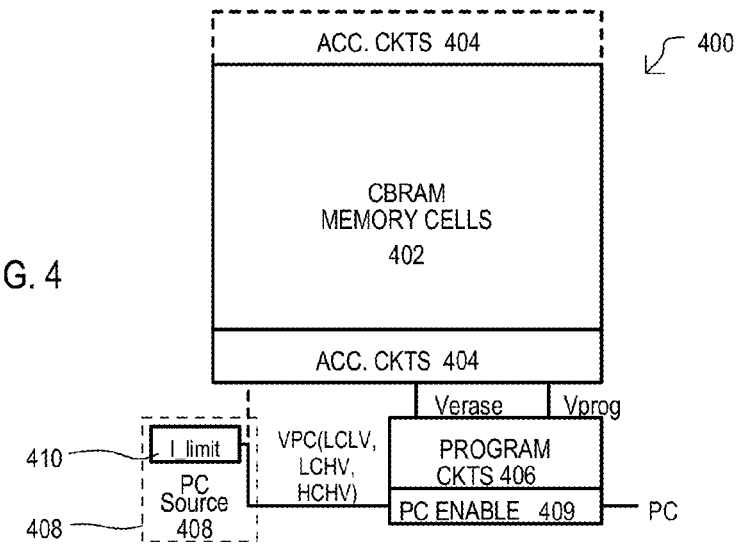
FIG. 4 is a block schematic diagram of a memory device having low current low voltage (LCLV), low current high voltage (LCHV) and/or high current high voltage (HCHV) pre-conditioning according to embodiments.

FIG. 4 is a block schematic diagram showing a memory device 400 according to another embodiment. A memory device 400 can include sections like those of FIG. 3, and such like sections can have the same or equivalent structures and/or functions to those shown in FIG. 3.

Memory device 400 can differ from that of FIG. 3 in that a pre-condition source 408 can provide various electrical conditions for a pre-condition operation that vary from standard program or erase. FIG. 4 shows three possible pre-conditions, LCLV (Low Current Low Voltage), LCHV (Low Current High Voltage) and HCHV (High Current High Voltage). An LCLV pre-conditioning can apply a lower current and lower voltage than a conventional program and/or erase. In one embodiment, in an LCLV pre-conditioning, a pre-condition source 408 can provide a first voltage (including a sequence of voltage pulses) having the same polarity as Vprog, but producing a lower current through and low voltage across CBRAM elements. In addition or alternatively, an LCLV can also include pre-condition source 408 providing a second voltage (including a sequence of voltage pulses) having the same polarity as Verase, but producing a lower current through and low voltage across, CBRAM elements. In embodiments that provide a reduced current flow through CBRAM type elements (e.g., LCLV, LCHV), a current limit circuit 410 can be included in a pre-condition source 408, or can be provided by access circuits 404.

A LCHV pre-conditioning can apply a lower current and higher voltage than a conventional program and/or erase. In one embodiment, in a LCHV pre-conditioning, a pre-condition source 408 can provide a first voltage (including pulses) having the same polarity as Vprog, but producing a lower current through and higher voltage across CBRAM elements. In addition or alternatively, a second voltage having the erase polarity can be applied that results in a lower current and higher voltage conditions than Verase.

An HCHV pre-conditioning can result in pre-condition source 408 enabling the application of a higher current and higher voltage than a conventional program and/or erase.

It is understood that embodiments can include a pre-condition source 408 that provides any one, or multiple (including all) of the pre-conditioning electrical conditions shown (i.e., LCLV, LCHV and/or HCHV).

Figure 5:
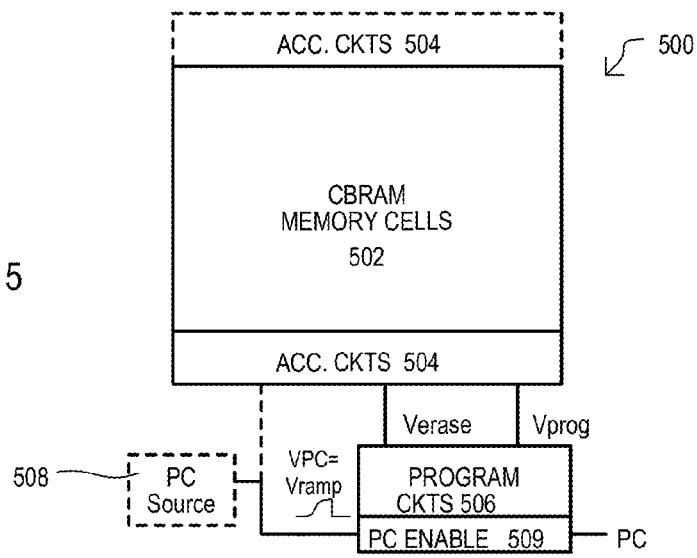
FIG. 5 is a block schematic diagram of a memory device having a ramped pre-conditioning voltage according to an embodiment.

FIG. 5 shows a memory device 500 according to another embodiment. A memory device 500 can include sections like those of FIG. 3, and such like sections can have the same or equivalent structures and/or functions to those shown in FIG. 3.

Memory device 500 can differ from that of FIG. 3 in that a pre-condition source 508 can enable one or more "ramping" voltages in a pre-conditioning operation. In one embodiment, in a pre-conditioning operation, one or more voltage pulses can be applied to elements that have a different rate of change than those of a standard program or erase operation. In one particular embodiment, a pre-condition source 508 can provide voltage pulses to CBRAM type elements that rise at a slower rate than Vprog pulses in a program operation. In addition or alternatively, a pre-condition source 508 can provide voltage pulses to CBRAM type elements that fall at a slower rate than Verase pulses in an erase operation.

Having shown memory devices that can provide pre-conditioning to memory elements, particular examples of such pre-conditioning operations will now be described.

FIG. 6 is a diagram showing shows a conventional pre-conditioning on a CBRAM type memory element 612. In a first part of a conventional pre-conditioning operation, a voltage Vprog can be applied across element 612 to induce a current Iprog. It is understood that a current Iprog can be dynamic, increasing as a resistance of element 612 decreases. In a second part of a conventional pre-conditioning operation, a voltage Verase, having a polarity opposite to that of Vprog, can be applied across element 612 to induce a current Ierase. As in the case of current Iprog, a current Ierase can be dynamic, decreasing as a resistance of element 612 increases.

FIG. 7 is a diagram showing an erase only type pre-conditioning (ERPC) operation according to one embodiment. A voltage V_ERPC, which can have a same polarity as Verase, can be applied across element 712. In the embodiment shown, voltage V_ERPC can be different from Verase. In one embodiment, an element 712 can be a CBRAM type element. As represented by the "X"-out portion of FIG. 7, an ERPC does not apply a voltage having the same polarity as Vprog.

FIG. 8 is a diagram showing a low current, low voltage pre-conditioning operation (LCLV PC) according to an embodiment. In a first part of an LCLV PC operation, a voltage V_P-LCLV, having a same polarity as Vprog but smaller magnitude, can be applied across element 812 to induce a current IP_LCLV. A current IP_LCLV can be less than Iprog. In some embodiments, such a current limiting can ensure that current IP_LCLV does not surpass some maximum value. In some embodiments, a current limit circuit 810 can limit IP_LCLV. In a second part of an LCLV PC operation, a voltage V_E-LCLV, having a same polarity as Verase but smaller magnitude, can be applied across element 812 to induce a current IE_LCLV. A current IE_LCLV can be less than Ierase, and in some embodiments, such limiting can be achieved with a current limit circuit 810'. In some embodiments, an element 812 can be a CBRAM type element.

FIG. 9 is a diagram showing a low current, high voltage pre-conditioning operation (LCHV PC) according to an embodiment. In a first part of an LCHV PC operation, a voltage V_P-LCHV, having a same polarity as Vprog but greater magnitude, can be applied across element 912 to induce a current IP_LCHV. A current IP_LCHV can be less than Iprog, and in some embodiments can be limited by current limit circuit 910. In a second part of an LCHV PC operation, a voltage V_E-LCHV, having a same polarity as Verase and greater magnitude, can be applied across element 912 to induce a current IE_LCHV. A current IE_LCLV can be less than Ierase, and in some embodiments, can be limited by a current limit circuit 910'.

Figure 10:
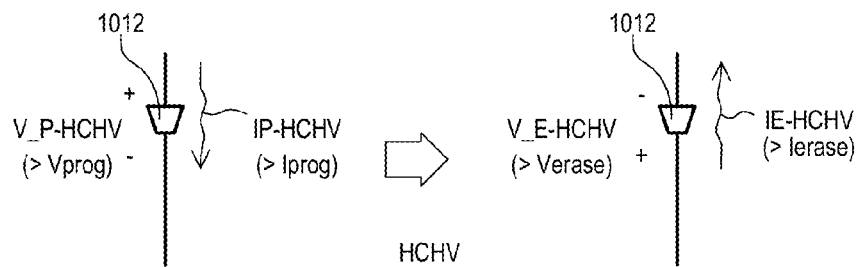
FIG. 10 is a diagram showing an HCHV pre-conditioning operation according to an embodiment.

FIG. 10 shows a high current, high voltage pre-conditioning operation (HCHV PC) according to an embodiment. In a first part of an HCHV PC operation a voltage V_P-HCHV, having a same polarity as Vprog but greater magnitude, can be applied across element 912 to induce a current IP_HCHV. A current IP_HCHV can be greater than Iprog. In a second part of an HCHV PC operation a voltage V_E-HCHV, having a same polarity as Verase and greater magnitude, can be applied across element 912 to induce a current IE_HCHV. A current IE_HCHV can be greater than Ierase.

FIGS. 11A to 11E are graphs showing voltage pre-conditioning operations according to various embodiments.

Figure 11A:
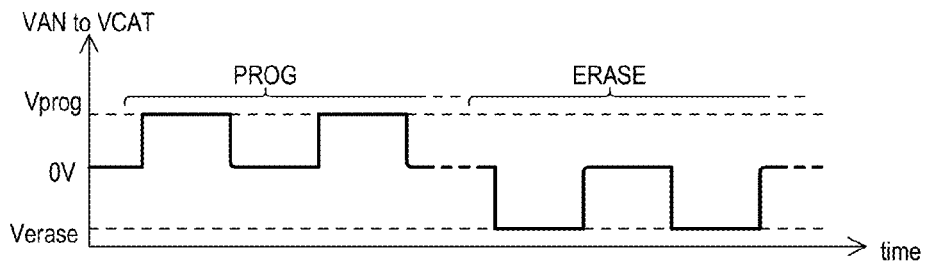
FIGS. 11A to 11E are timing diagram showing various ramped pre-conditioning voltages according to various embodiments.

FIG. 11A is a timing diagram showing a conventional pre-conditioning operation. FIG. 11A shows a voltage applied across a CBRAM type element taken from anode to cathode (VAN to VCAT). In a first part of a conventional pre-conditioning (PROG), a voltage Vprog can be applied across an element in a series of pulses. In a second part of a conventional pre-conditioning (ERASE), a voltage Verase can be applied across an element in another series of pulses. In the embodiment shown, pulses in the conventional pre-conditioning have abrupt changes in voltage level (i.e., little or no ramping).

Figure 11B:
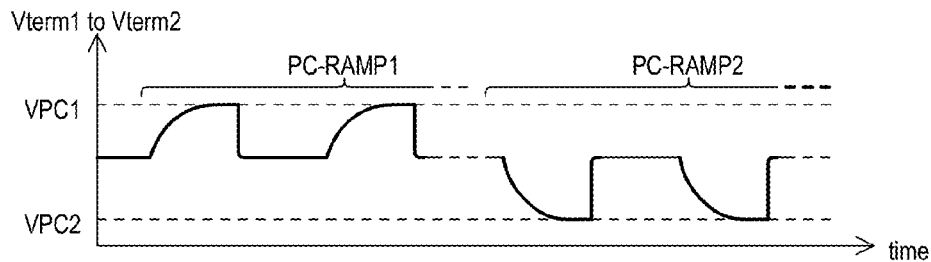

FIG. 11B is a timing diagram showing a ramped voltage pre-conditioning operation. FIG. 11B shows a voltage applied across a memory element, taken from a first terminal to a second terminal (Vterm1 to Vterm2). In a first part of a ramped voltage pre-conditioning (PC-RAMP1), a voltage VPC1 can be applied across an element in a series of pulses. However, such pulses can rise in level at a slower rate that PROG of FIG. 11A (i.e., they are "ramped"). In addition, or alternatively, a ramped voltage pre-conditioning (PC-RAMP2) can include ramped voltages of the opposite polarity to PC-RAMP1. Such pulses can have ramped shapes, as compared to a conventional pre-conditioning like that shown in FIG. 11A.

Figure 11C:
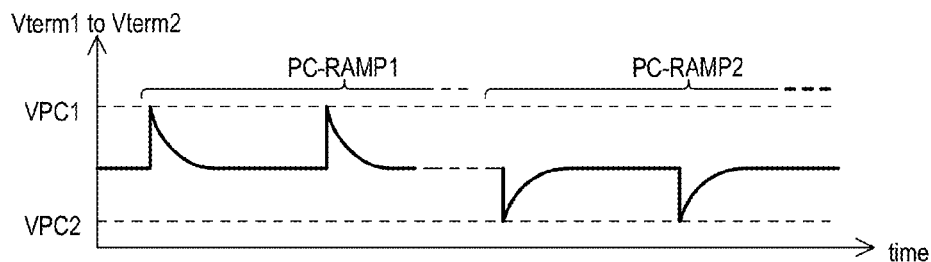

FIG. 11C is a timing diagram showing a ramped voltage pre-conditioning operation according to another embodiment. FIG. 11C shows pre-conditioning pulses that fall in level at a slower rate than those of FIG. 11A.

Figure 11D:
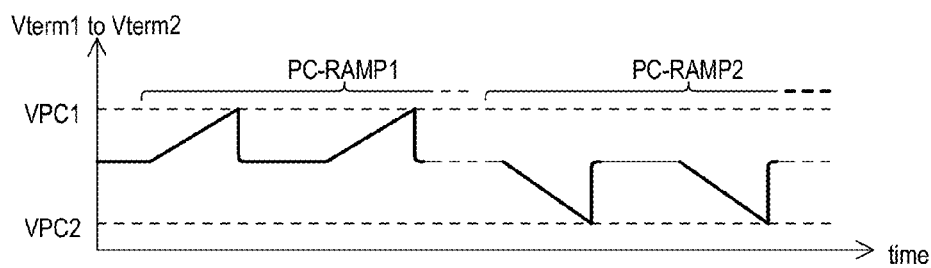

FIG. 11D shows a voltage applied across a memory element, like that of FIG. 11B, but with a different (more linear) shaped waveform.

Figure 11E:
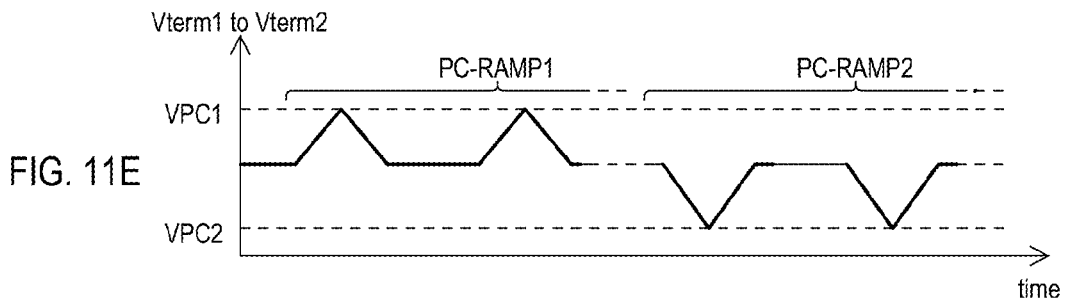

FIG. 11E is a timing diagram showing a ramped voltage pre-conditioning operation according to a further embodiment. FIG. 11D shows a voltage applied across a memory element, like that of FIG. 11B, but with a waveform having both a rising and falling ramped profile.

Figures 0, 12A:
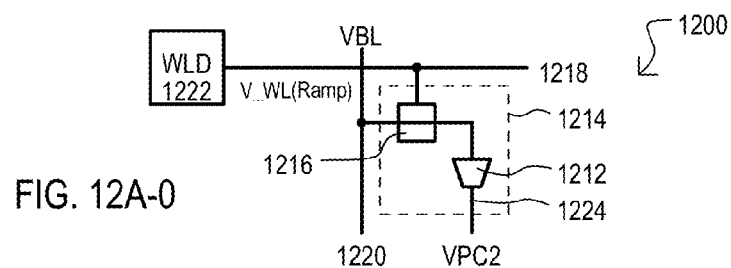
FIGS. 12A-0/1 are diagrams showing ramped voltage pre-conditioning according to embodiments.
Figures 1, 12A:
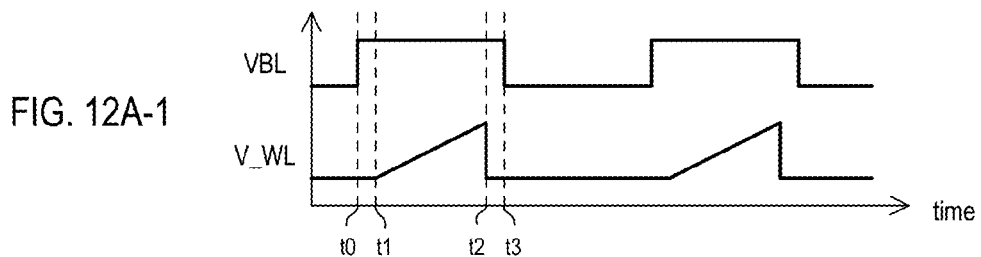
Figures 0, 12B:
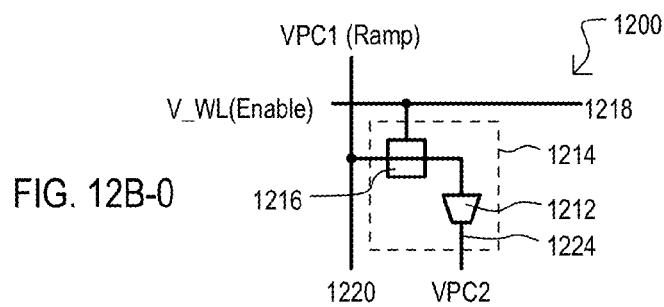
Figures 1, 12B:
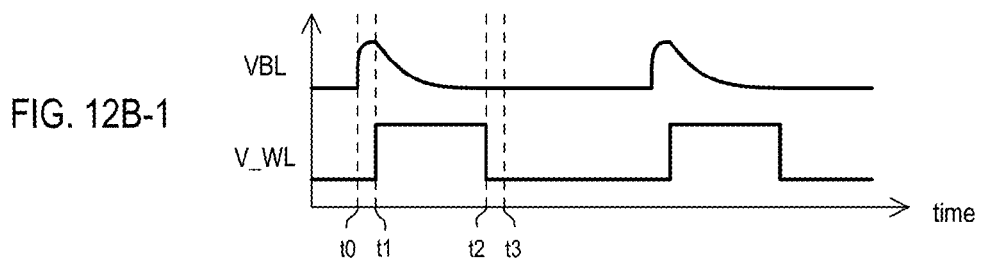

FIGS. 12A-0 to 12B-1 are diagrams showing ramped voltage pre-conditioning circuits according to particular embodiments. FIGS. 12A-0/1 shows one example of a ramped word line (Ramp WL) pre-conditioning. FIG. 12B-0/1 shows one example of a ramped bit line (Ramp BL) pre-conditioning.

FIG. 12A-0 shows a portion of a memory device 1200 according to an embodiment, including a memory cell 1214 connected at an intersection of a word line 1218 and a bit line 1220. It is understood that multiple such cells can be connected to word line 1218 to form a row of memory cells, and multiple such cells can be connected to bit line 1220 to form a column of memory cells.

Memory cell 1214 can include an access device 1216 and a memory element 1212. In one embodiment, a memory element 1212 can be a CBRAM type element. A path through access device 1216 can be controlled according to word line 1218 (i.e., the conductivity of a path through access device 1216 can be based on a voltage of word line 1218 or a current provided by word line 1218). Element 1212 can have a first terminal connected to bit line 1220 by access device 1216, and a second terminal connected to a node 1224.

In the embodiment shown, in a pre-conditioning operation, a first voltage VBL can be applied to bit line 1220, while a second voltage VPC2 can be applied to node 1224. It is understood that voltages VBL and VPC2 are substantially not ramped. A word line driver 1222 can drive word line 1218 with a ramped voltage (V_WL(Ramp)). Such a ramped word line voltage (V_WL(Ramp)), can result in a voltage at a first terminal of element 1212 ramping up to VPC1.

FIG. 12A-1 is a timing diagram showing one example of a pre-conditioning operation for an embodiment like that of FIG. 12A-0. FIG. 12A-1 shows a bit line voltage VBL and a word line voltage V_WL. At time t0, a bit line can be driven to a pre-condition voltage. However, because V_WL is low, such a voltage is not applied across a fresh element.

At time t1, a V_WL can start to ramp up, consequently, it will pass voltage VBL in a ramped fashion to a fresh memory element.

At time t2, V_WL can return to a low level, once again isolating an element from VBL.

At time t3, VBL can return low.

In this way, a ramped pre-condition voltage can be applied to a memory element with a ramped word line.

FIG. 12B-0 shows a portion of a memory device 1200 according to another embodiment showing features like those of FIG. 12A-0. However, unlike FIG. 12A-0, in FIG. 12B-0 a bit line voltage VPC1 can be a ramped voltage. A word line voltage V_WL(Enable) can place access device 1216 into a conductive state, allowing a ramped bit line voltage PC1 to be applied to an element 1212. At time t0, a bit line can be pre-charged to a pre-condition voltage. However, because V_WL is low, such a voltage is not applied across a fresh element.

At time t1, a V_WL can go high, connecting a fresh element to the bit line. In the particular embodiment shown, a bit line can act as a discharging capacitor, passing voltage VBL in a ramped fashion to a fresh memory element.

At time t2, V_WL can return to a low level, once again isolating an element from VBL.

At time t3, VBL can return low.

In this way, a ramped pre-condition voltage can be applied to a memory element as an electro-capacitive charge.

It is understood that according to additional embodiments, a voltage applied to another terminal VPC2 can be a ramped voltage.

In this way, a ramped pre-condition voltage can be applied to a memory element via a bit line or other node directly connected to a memory element terminal.

Figure 13:
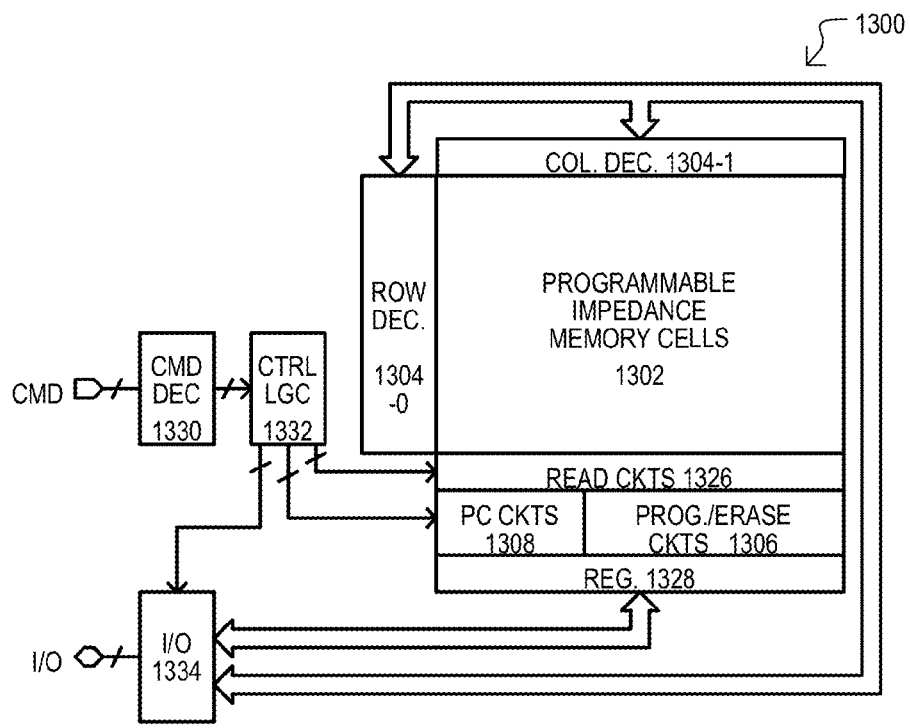
FIG. 13 is a block schematic diagram of a memory device that can generate pre-conditioning electrical conditions on the device.

FIG. 13 is a block schematic diagram of a memory device 1300 according to a further embodiment. FIG. 13 shows an embodiment in which pre-condition circuits can be included as part of a memory device 1300. A memory device 1300 can include sections like those of FIG. 1, and such like sections can have the same or equivalent structures and/or functions to those shown in FIG. 1. In particular embodiments, FIG. 13 can be one implementation of any of those shown in FIGS. 1 to 5.

Memory device 1300 can differ from that of FIG. 1 in that access circuits can include a row decoder 1304-0 and column decoder 1304-1. In response to address data, row and column decoders (1304-0/1) can select groups of memory cells for reading and/or programming. Further, in the embodiment shown, it is assumed that programmable impedance memory cells 1302 are programmable to one impedance state and erasable to another. Accordingly, a programming circuit can be a program and erase circuit 1306.

A memory device 1300 can further include read circuits 1326 which can sense impedance values of programmable impedance memory cells 1302 to generate read output data. In particular embodiments, read circuits 1326 can include current and/or voltage sense amplifiers.

A data register 1328 can store read data values output from, or write data values to be programmed into, programmable impedance memory cells 1302. In some embodiments, a data register 1328 can input and output data in parallel (i.e., bytes, words, double words, etc.). However, in other embodiments, data register 1328 can be accessed by one or more serial data paths.

In the particular embodiment shown, input/output (I/O) circuits 1334 can receive address values and write data values, and output read data values. Received address values can be applied to row and column decoders (1304-0/1) to select programmable impedance memory cells 1302. Read data can be output over I/O circuits 1334 from data register 1328. Write data on I/O circuits 1334 can be stored in data registers 1328.

In the embodiment shown, command data can be received by a command decoder 1330. According to received command data, control logic 1332 can provide signals that control various other portions of the memory device 1300.

In some embodiments, a memory device 1300 can include use monitor circuits that can track use of memory cells 1302 (e.g., cycles). Such use data can determine when memory cells 1302 are "fresh".

As noted above, a memory device 1300 can include pre-conditioning circuit 1308. A pre-conditioning circuit 1308 can apply pre-conditioning voltage and/or currents to programmable impedance elements of the memory device 1300 according to any of the embodiments described herein, or equivalents. A pre-conditioning circuit 1308 can be activated to pre-condition programmable impedance elements in response to predetermined conditions (e.g., upon power-up of the device). In addition or alternatively, a pre-conditioning circuit 1308 can be activated in response to a command received via I/O circuits 1334.

As noted previously, in some embodiments, pre-condition operations can be "mass" operations that pre-condition large numbers of cells at the same time. In particular embodiments, the number of memory cells pre-conditioned at one time can be greater than a number of memory cells accessed in an erase and/or program operation.

In this way, pre-conditioning circuits can be built-in to a memory device.

Figure 14:
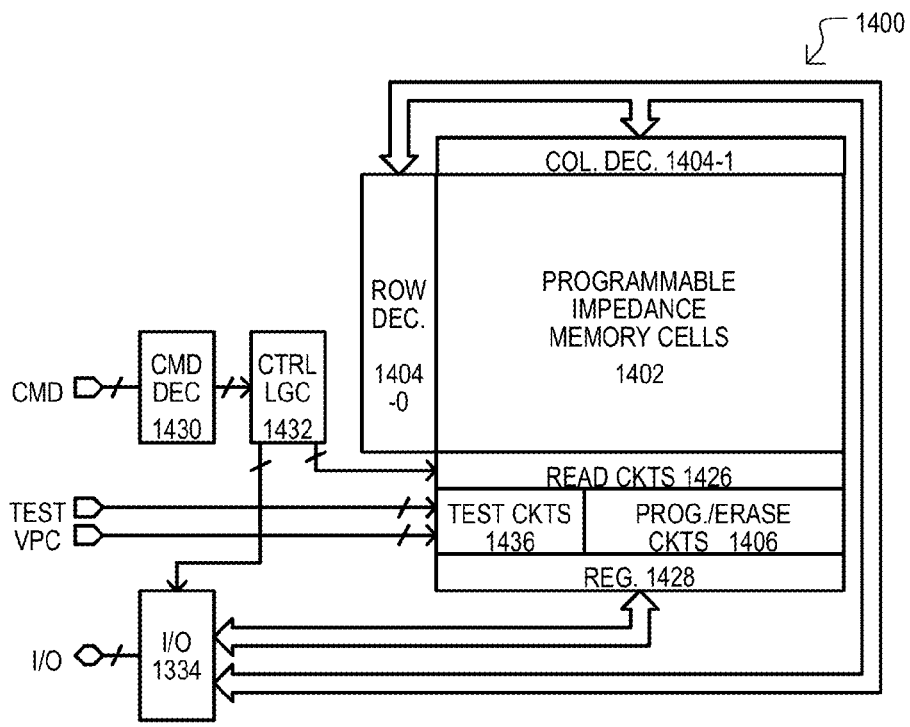
FIG. 14 is a block schematic diagram of a memory device that receives pre-conditioning electrical conditions via test inputs to the device.

FIG. 14 is a block schematic diagram showing a memory device 1400 according to a further embodiment. FIG. 14 shows an embodiment in which pre-condition circuits can be applied via test circuits included as part of a memory device 1400. A memory device 1400 can include sections like those of FIG. 13, and such like sections can have the same or equivalent structures and/or functions to those shown in FIG. 13. In particular embodiments, FIG. 13 can be one implementation of any of those shown in any of FIGS. 1 to 5.

FIG. 14 differs from FIG. 13 in that test circuits 1436 can receive test control values TEST and one or more pre-condition voltages (VPC). In response to TEST control values, a test circuit 1436 can access to programmable impedance elements of the device to enable the application of pre-condition voltage(s) (VPC).

In this way, pre-conditioning conditions can be applied to memory elements via test circuits.

Figure 15:
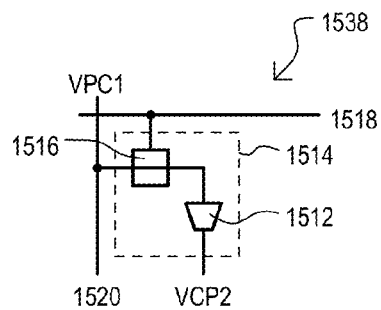
FIGS. 15 to 17 are schematic diagrams showing preconditioning operations for memory cells having access devices according to various embodiments.
Figure 16:
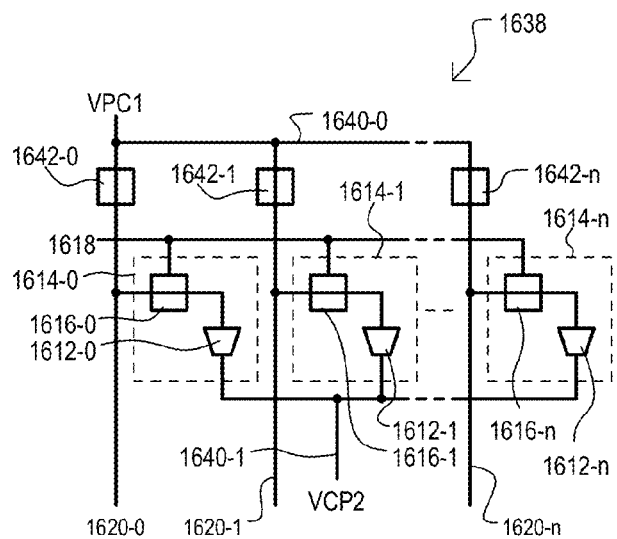
Figure 17:
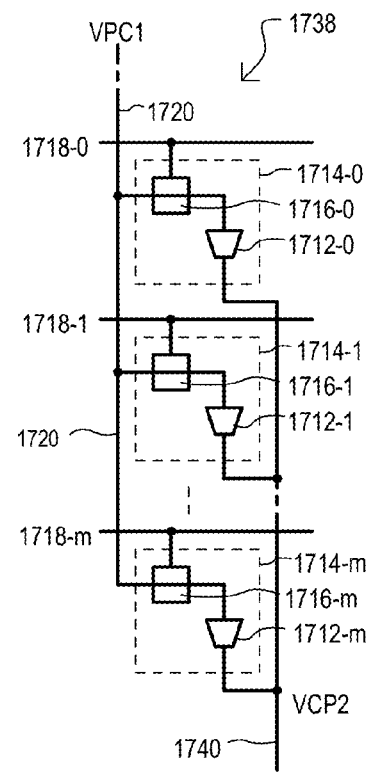

FIGS. 15-17 are schematic diagrams showing pre-condition operations on programmable impedance memory cell architectures having an access device, according to various embodiments.

FIG. 15 shows a configuration like that of FIG. 12A-0/1 or 12B-0/1. Within a memory array 1538, a first pre-condition voltage VPC1 can be applied to a first terminal of a programmable impedance element 1512 via a bit line 1520 and through an access device 1516. A second pre-condition voltage VPC2 can be applied to a second terminal of a programmable impedance element 1512. Any or both of pre-condition voltages VPC1 and VPC2 can be static voltage, or dynamic voltages (e.g., ramped) or can include multiple voltage pulses, including pulses with different voltage levels. Any of the voltages applied to a word line 1518, bit line (VPC1), or common terminal (VPC2) can be voltages that ramp up, ramp down, or ramp up and ramp down.

FIG. 16 shows a configuration in which pre-condition voltage(s) can be applied to a row of elements in parallel. A memory array 1638 can include a row of memory cells 1614-0 to -n, each including an access device 1616-0 to -n and a programmable impedance element 1612-0 to -n. Access devices (1616-0 to -n) of the same row can be commonly enabled by a word line 1618. Bit lines 1620-0 to -n can be connected to a first common node 1640-0 by column select circuits 1642-0 to -n. Second terminals of elements (1612-0 to -n) can be commonly connected to a second bias node 1640-1.

In a pre-condition operation, a first pre-condition voltage VPC1 can be applied at first bias node 1640-0. Column select circuits (1642-0 to -n) can provide pre-condition voltage VPC1 to via bit lines 1620-0 to -n. In addition, a second pre-condition voltage VPC2 can be applied to second terminals of elements (1612-0 to -n) via second bias node 1640-1. Pre-condition voltages VPC1 and VPC2 can be subject to the same variations noted for FIG. 15.

FIG. 17 shows a configuration in which pre-condition voltage(s) can be applied to a column of elements in parallel. A memory array 1738 can include a column of memory cells 1714-0 to -m having a structure like that of FIG. 16. However, unlike FIG. 16, access devices (1716-0 to -m) can be commonly connected to a same bit line 1720, with each access device (1716-0 to -m) being enabled by a different word line 1718-0 to -m. In a pre-condition operation, a first pre-condition voltage VPC1 can be applied to first terminals of elements (1712-0 to -n) via bit line 1720, while a second pre-condition voltage VPC2 can be applied to second terminals of elements (1712-0 to -m) via bias node 1740. Pre-condition voltages VPC1 and VPC2 can be subject to the same variations noted for FIG. 15.

Embodiments can combine any of the approaches noted above to enable pre-conditioning of multiple rows and/or columns of memory elements in memory cells with access devices.

Figure 18:
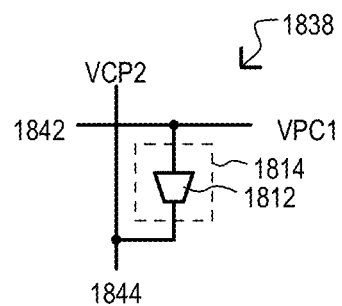
FIGS. 18 and 19 are schematic diagrams showing preconditioning operations for a cross-point type array according to various embodiments.
Figure 19:
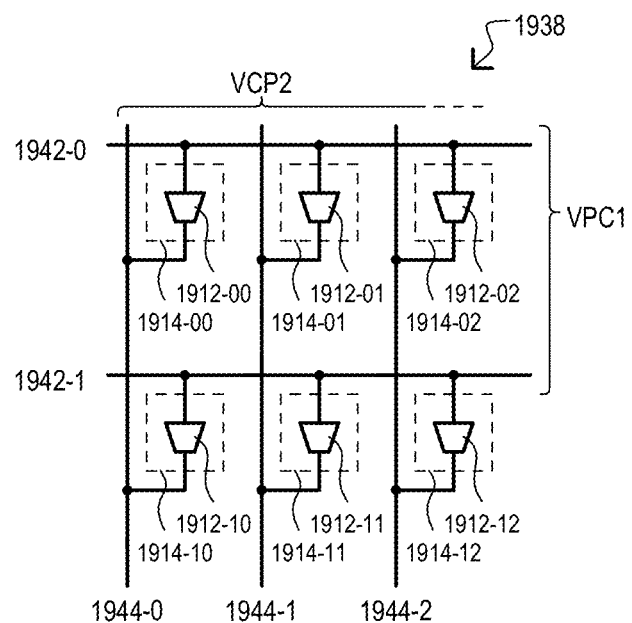

FIGS. 18 and 19 are schematic diagrams showing pre-condition operations on programmable impedance memory cell architectures having a "cross-point" type array.

FIG. 18 shows a memory cell 1814 in a cross-point type array 1838. A memory cell 1814 can include a programmable impedance element 1812 having one terminal connected to a first line 1844 and a second terminal connected to a second line 1842. First and second lines (1844 and 1842) can be disposed in different directions, and in particular embodiments, can be perpendicular to one another. In a pre-condition operation, a first pre-condition voltage VPC1 can be applied to a first terminal of a programmable impedance element 1812 via a first line 1844, while a second pre-condition voltage VPC2 can be applied to a second terminal of an element 1812 via a second line 1842.

FIG. 19 shows a configuration in which pre-condition voltage(s) can be applied to a group of elements in parallel. A memory array 1938 can include elements 1912-00 to -12 arranged into array, each element (1912-00 to -12) having a first terminal connected to a first line (1944-0 to -2) and a second terminal connected to a second line (1942-0/1).

In a pre-condition operation, a first pre-condition voltage VPC1 can be applied to first terminals of the elements (1912-00 to -12) via first lines (1944-0 to -2), and a second pre-condition voltage VPC2 can be applied to second terminals of the elements (1912-00 to -12) via second lines (1942-0 to -2).

Embodiments can combine any of the approaches noted above to enable pre-conditioning of multiple rows and/or columns of memory elements in a cross-point type array.

Figure 20:
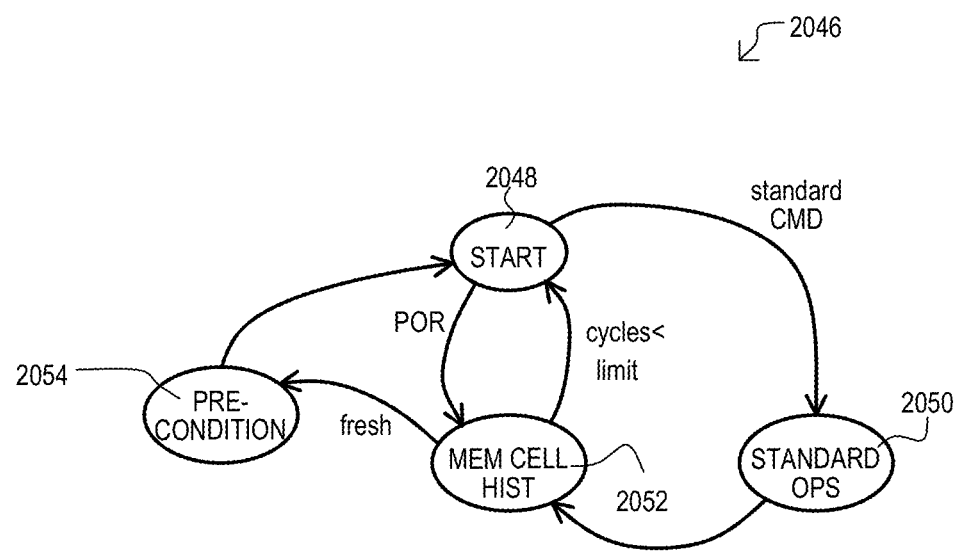
FIG. 20 is a state diagram of memory device operations according to an embodiment.

FIG. 20 is a state diagram showing a memory device operation 2046 that can include pre-conditioning.

Referring to FIG. 20, from a start state 2048, upon receiving a standard command (standard CMD), a memory device can execute standard operations 2050. In one embodiment, standard operations (2050) can include read and program operations according to embodiments above, and equivalents.

In response to a power-on reset state (POR), a memory cell history can be checked 2052. In the particular embodiment shown, checking a memory cell history can include checking a number of program cycles to which the memory elements have been subjected. In the embodiment shown, if a memory cell history indicates that the memory cells are "fresh", the memory cells can be subject to a pre-condition operation 2054.

It is noted that while the embodiment of FIG. 20 can execute pre-conditioning in response to a POR state, other embodiments can base pre-conditioning on other criteria. As but a few examples, pre-conditioning can be performed in response to a received command or performed based on state values stored in memory device.

While embodiments above have shown memory devices, operations and corresponding methods, additional methods according to embodiments will now be described with reference to flow diagrams.

Figure 21:
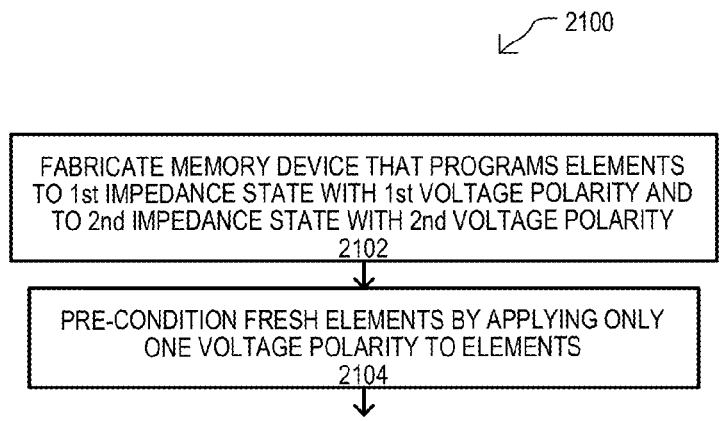
FIG. 21 is a flow diagram of a pre-conditioning operation according to an embodiment.

FIG. 21 is a flow diagram of a method 2100 according to an embodiment. A method 2100 can include fabricating a memory device that programs elements to a first impedance state with a first voltage polarity and to a second impedance state with a second voltage polarity (2102).

A method 2100 can further include pre-conditioning fresh elements by applying only one voltage polarity to the elements (2104).

Such an embodiment is in contrast to conventional CBRAM pre-conditioning methods that apply both program voltages and erase voltages that are of opposite polarity to the program voltages.

Figure 22:
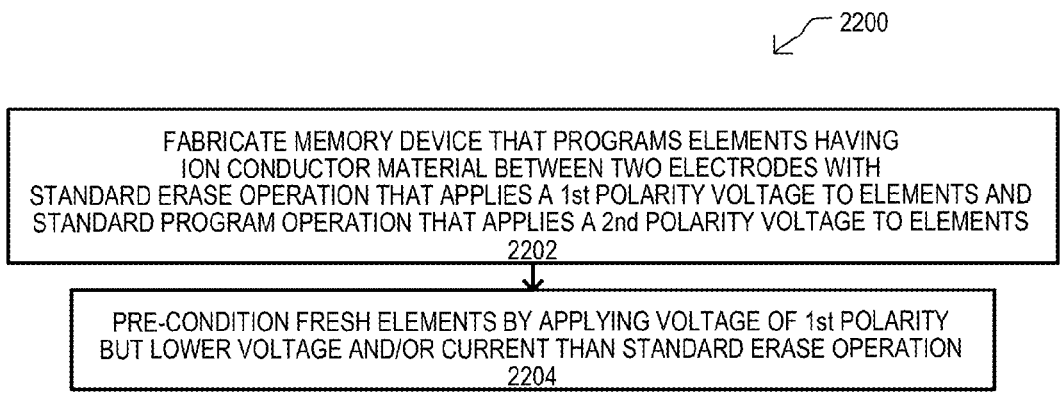
FIG. 22 is a flow diagram of a pre-conditioning operation according to another embodiment.

FIG. 22 is a flow diagram of a method 2200 according to another embodiment. A method 2200 can include fabricating a memory device that programs elements having an ion conductor or material between two electrodes (2202). Such programming of elements can be with a standard erase operation that applies a first polarity voltage to the elements, and a standard program operation that applies a second polarity voltage to the elements. In very particular embodiments, such elements can be CBRAM type elements that are erasable to a high resistance state and programmable to a lower resistance state. In particular embodiments, an ion conductor can include any of a chalcogenide, include $GeS_2$ and/or a metal oxide.

A method 2200 can further include pre-conditioning fresh elements by applying a voltage of the first polarity, but at a lower voltage and/or current than a standard erase operation (2204).

Figure 23:
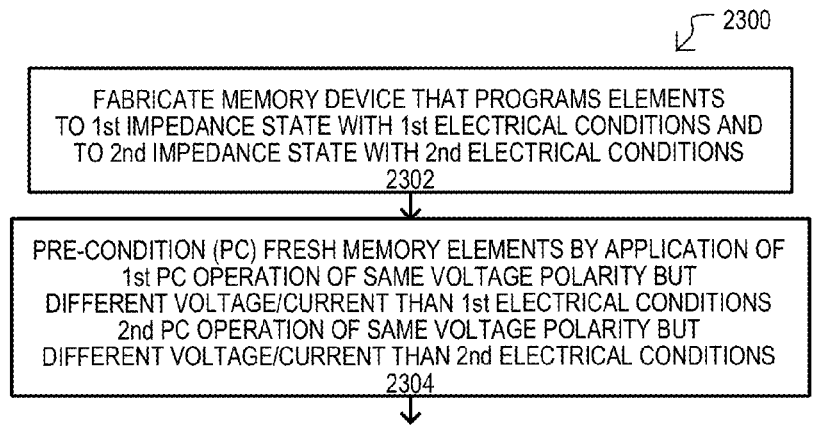
FIG. 23 is a flow diagram of a pre-conditioning operation according to a further embodiment.

FIG. 23 is a flow diagram of a method 2300 according to an embodiment. A method 2300 can include fabricating a memory device that programs elements to a first impedance state with first electrical conditions and to a second impedance state with second electrical conditions (2302).

A method 2300 can further include pre-conditioning (PC) fresh elements with first and second PC operations. A first PC operation can be with a same voltage polarity, but different voltage magnitude and/or current than the first electrical conditions. Similarly, a second PC operation can be with a same voltage polarity, but different voltage magnitude and/or current than the second electrical conditions.

Figure 24:
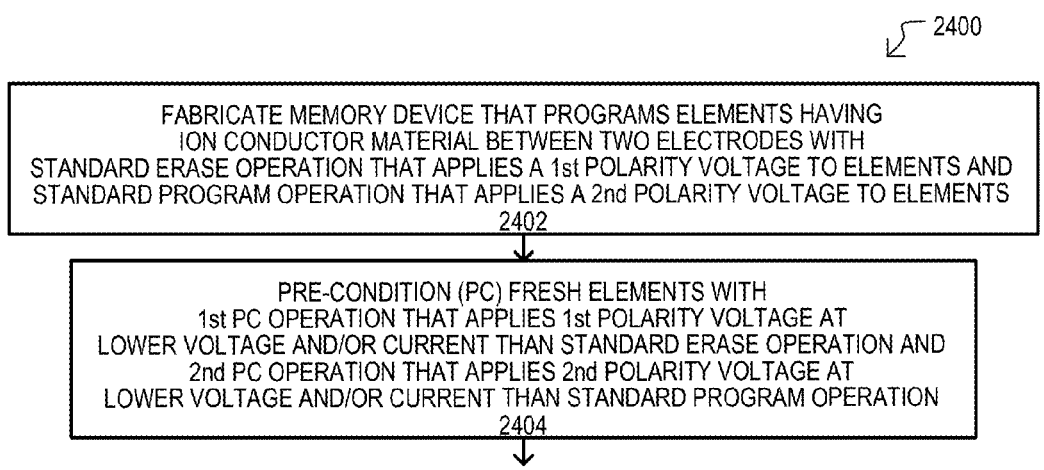
FIG. 24 is a flow diagram of a pre-conditioning operation according to yet another embodiment.

FIG. 24 shows a method 2400 according to a further embodiment. In box 2402, a method 2400 can include actions like those of box 2202 in FIG. 22. Such actions can be subject to the same variations noted for 2202.

A method 2400 can further include pre-conditioning (PC) fresh elements with a first PC operation and a second PC operation. A first PC operation can apply a first polarity voltage (i.e., same polarity as a standard erase operation) at a lower voltage and/or current than a standard erase operation. A second PC operation can apply a second polarity voltage (i.e., same polarity as a standard program operation) at a lower voltage and/or current than a standard program operation (2404).

Figure 25:
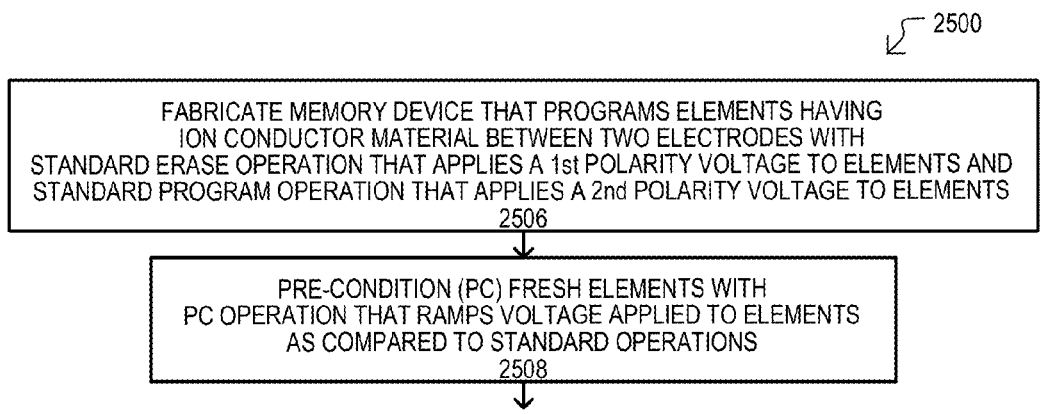
FIG. 25 is a flow diagram of a method according to another embodiment.

FIG. 25 shows a method 2500 according to a further embodiment. In box 2502, a method 2500 can include actions like those of box 2202 in FIG. 22. Such an action can be subject to the same variations noted for 2202.

A method 2500 can further include pre-conditioning (PC) fresh elements with a PC operation that ramps a voltage applied to the elements as compared to standard erase and program operations (2502).

Pre-conditioning as described herein and equivalents can result in improved memory device performance. Experimental results showing possible advantages will now be described. The experimental results are for CBRAM type elements having a $GeS_2$ based ion conductor layer, having silver formed therein as an ion conducting element. It is understood that such results, are provided by way of example, and should not be construed as limiting to the embodiments.

In the various embodiments shown, it is understood that voltage polarities are taken from the anode to cathode of the CBRAM type elements.

Figure 26:
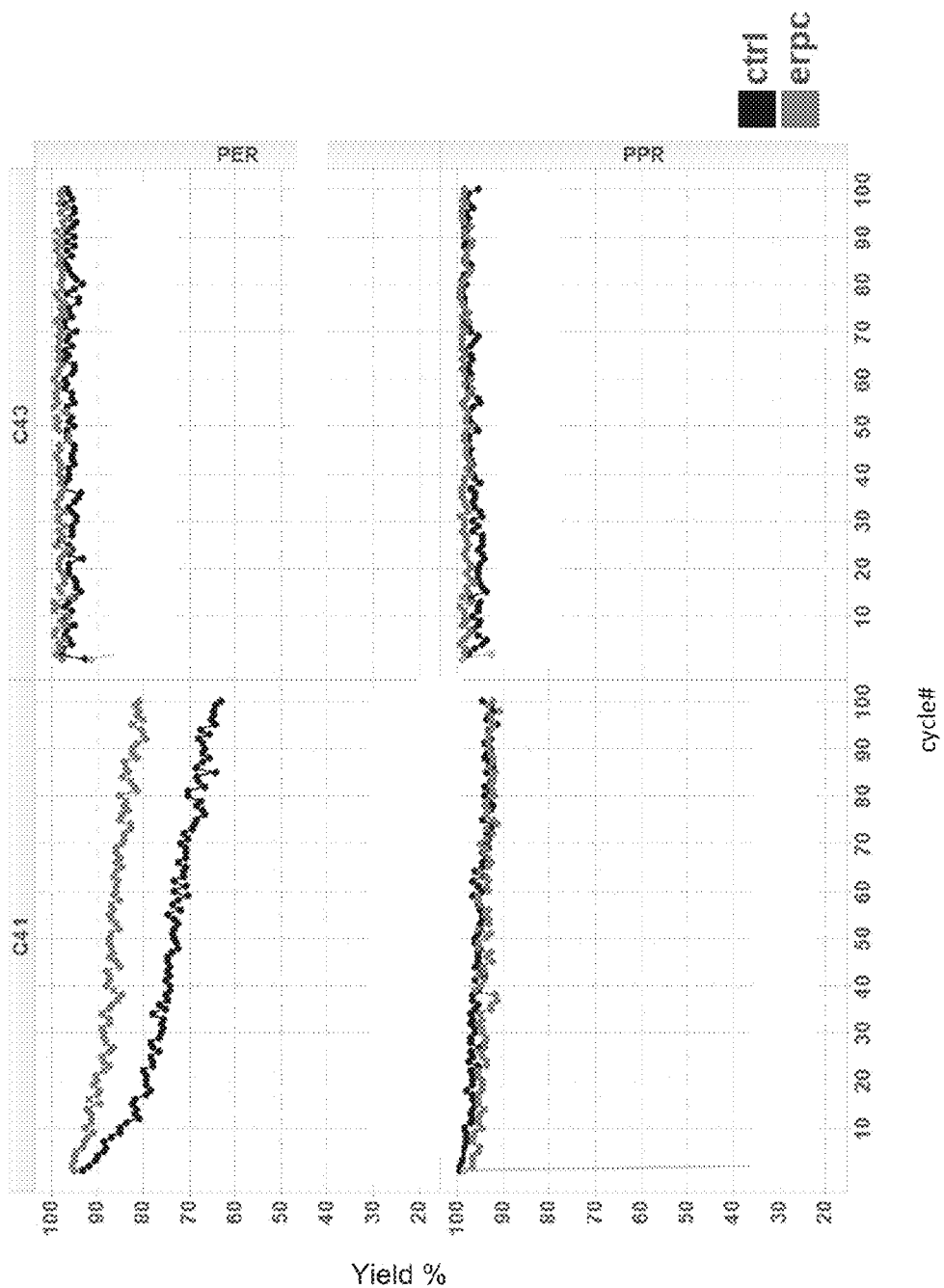
FIG. 26 is a graph showing a yield comparison between a control group and an erase only pre-condition group.

FIG. 26 shows a yield comparison between a control group (ctrl) and an erase only pre-condition group (erpc). A control group (ctrl) can receive three conventional cycles in a pre-conditioning operation that can apply first voltages of about +2.3 volts, and second voltages of about −1.6 volts for about 1 second. The erpc group can apply only a negative voltage of about −1.2 volts for 10 seconds. Group C41 shows elements that are programmed and erased conventionally with non-ramped pulses. Group C43 shows elements that are programmed and erased conventionally with ramped pulses.

Accordingly, an ERPC operation can improve yields.

Figure 27:
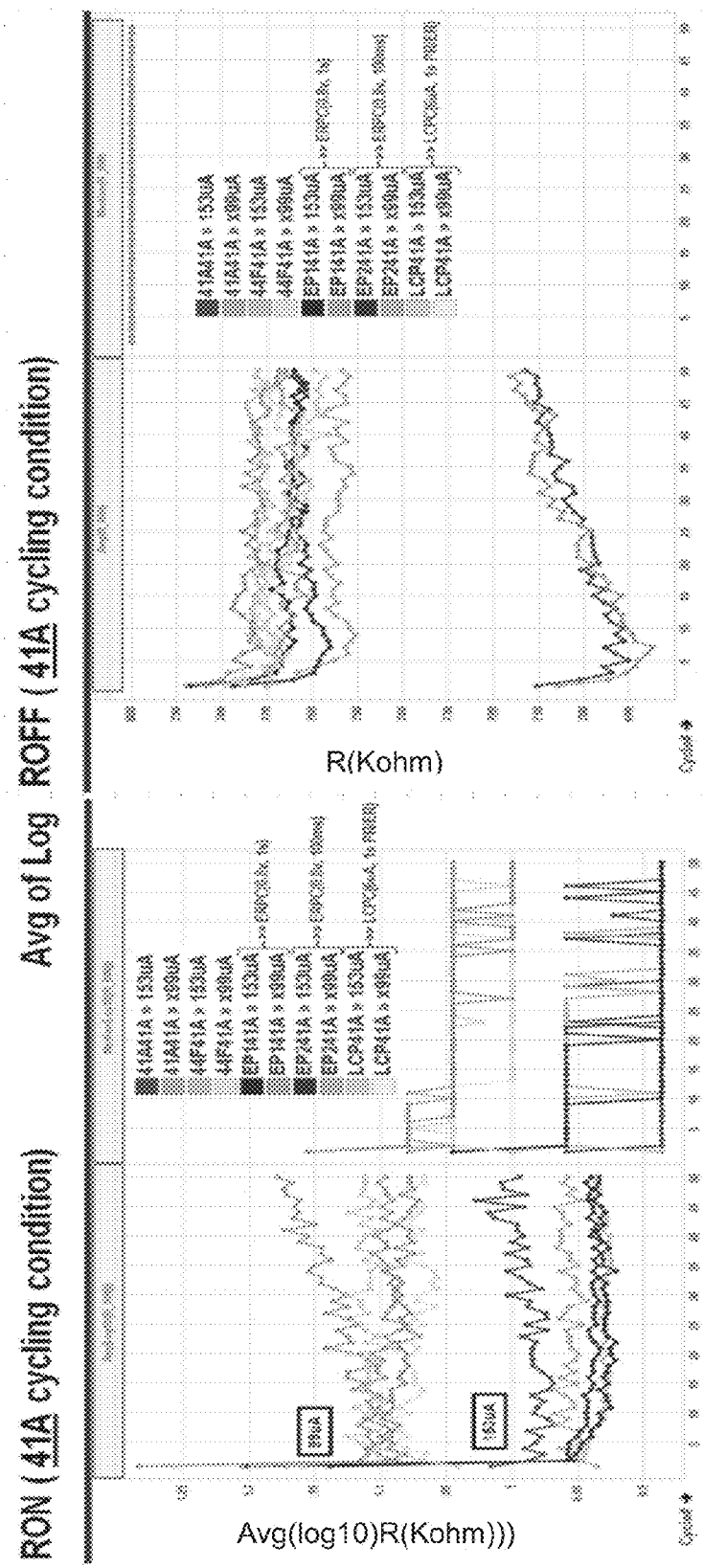
FIG. 27 are graphs showing memory element resistance following program operations and erase operations for two ERPC cases.

FIG. 27 shows a memory element resistance following program operations (RON) and erase operations (ROFF) for two erase only pre-condition (ERPC) cases (−0.8 V, 1s pulse; −0.8 V, 100 ms pulse) and a low current pre-charge (LCPC) case (6 uA, 1s, both program and erase polarity pulses). Such resulting resistance values are compared to conventional PC cases.

Accordingly, ERPC operation and LCPC operations can provide lower RON resistances, and higher ROFF resistances.

Figure 28:
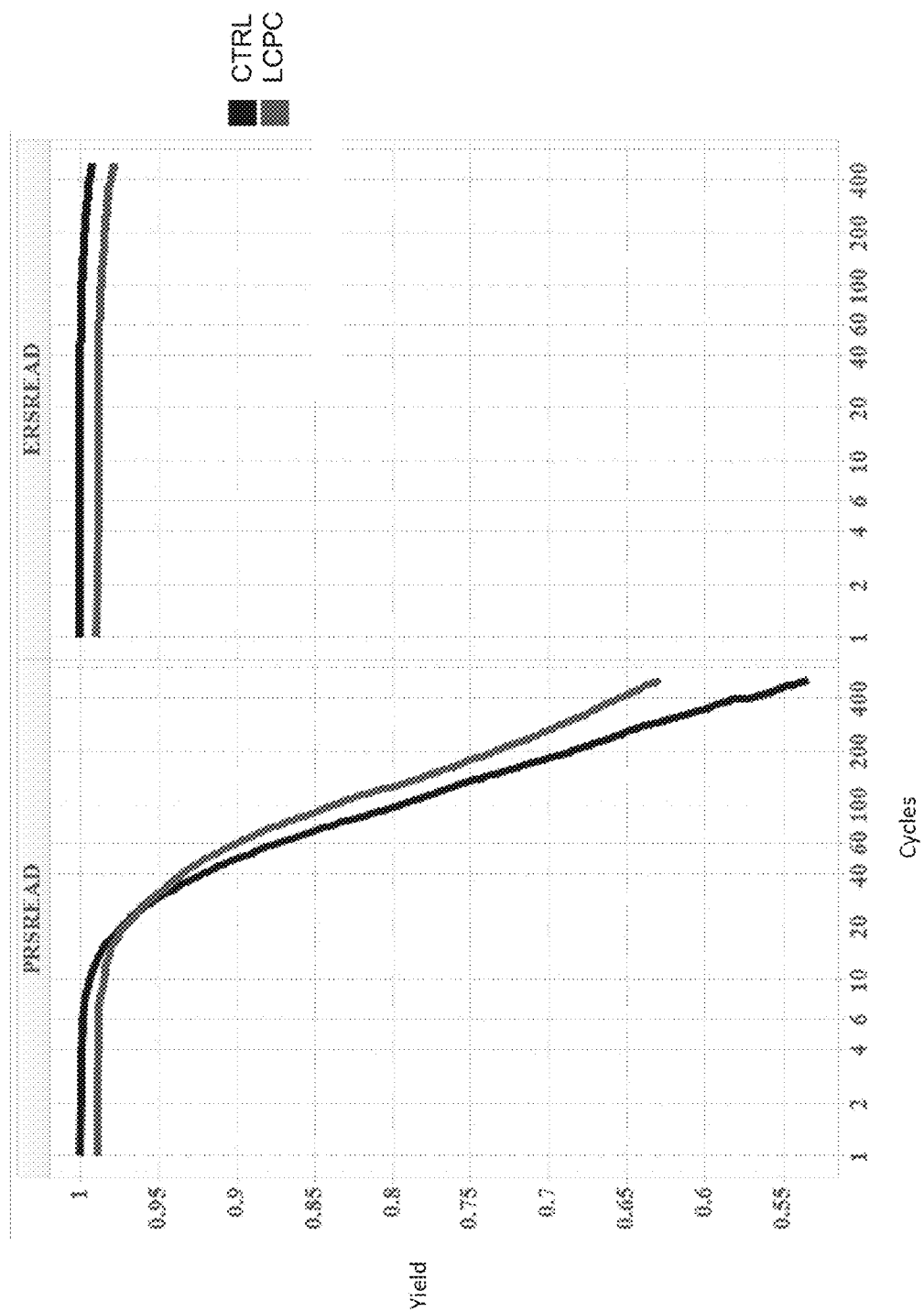
FIG. 28 is a graph showing element yields for a conventional pre-conditioned device versus elements subject to a low current pre-conditioning (LCPC).

FIG. 28 shows element yields for a conventional pre-conditioned device (CTRL) versus elements subject to a low current pre-conditioning (LCPC). Such a LCPC includes one cycle at +0.9 volts for one second with a current limit of 6uA, and one cycle at −1.6 volts for one second.

As shown, an LCPC can improve yields over conventionally pre-conditioned devices.

Figure 29:
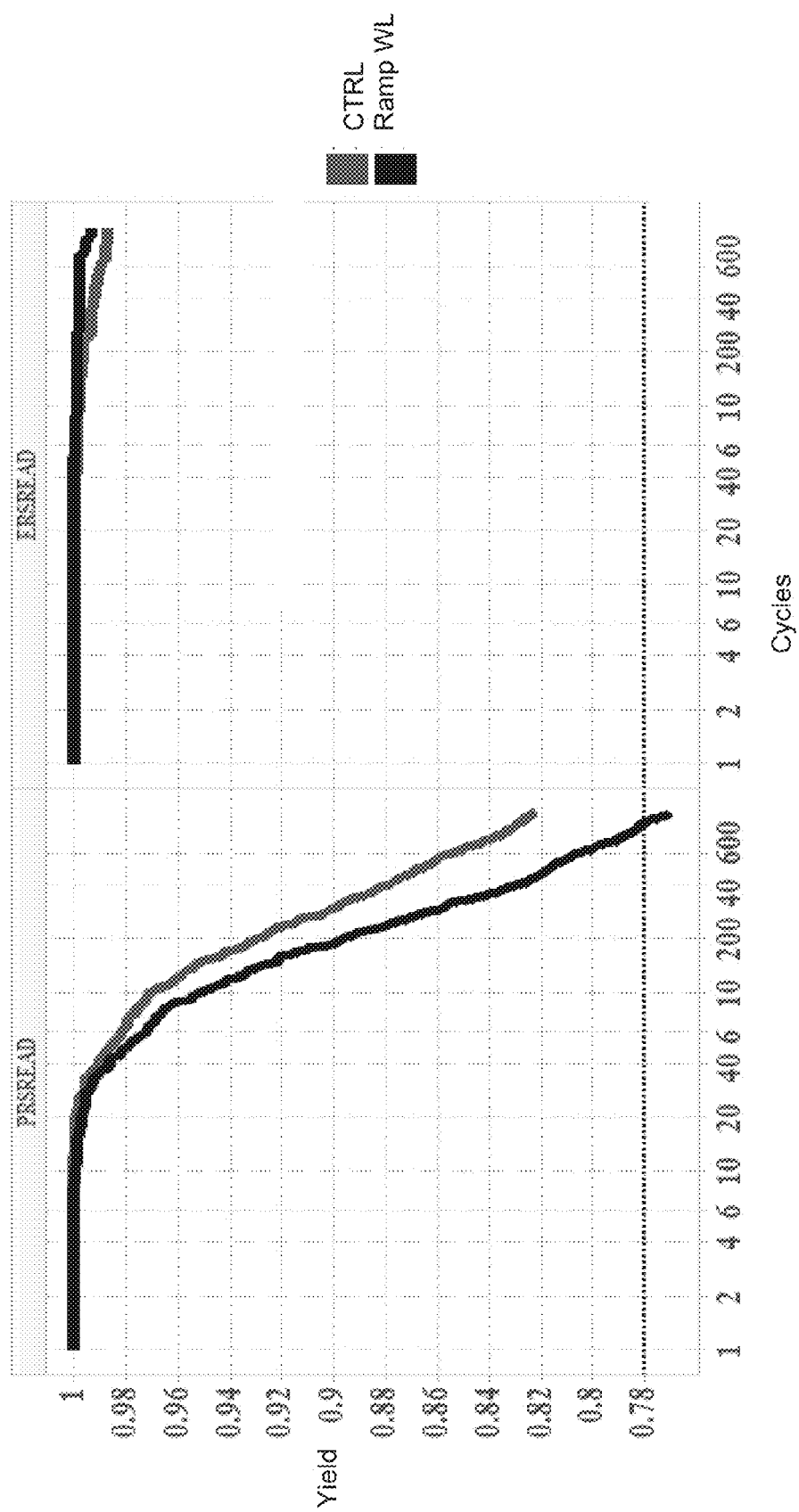
FIG. 29 are graphs showing element yields for a conventional pre-conditioned device versus elements subject to a ramped word line pre-conditioning.

FIG. 29 shows element yields for a conventional pre-conditioned device (CTRL) versus elements subject to a ramped word line pre-conditioning (Ramp WL). Such a Ramp WL includes a first cycle that ramps a word line from 0.6 V to 2.0 V to ramp a voltage of +0.9 volts across an element. Such ramping can occur at 0.1 V increments over 0.18 ms pulse sections. In a second cycle, −1.6 volts for one second is applied.

As shown, a ramp word line can improve yields over conventionally pre-conditioned devices.

Figure 30:
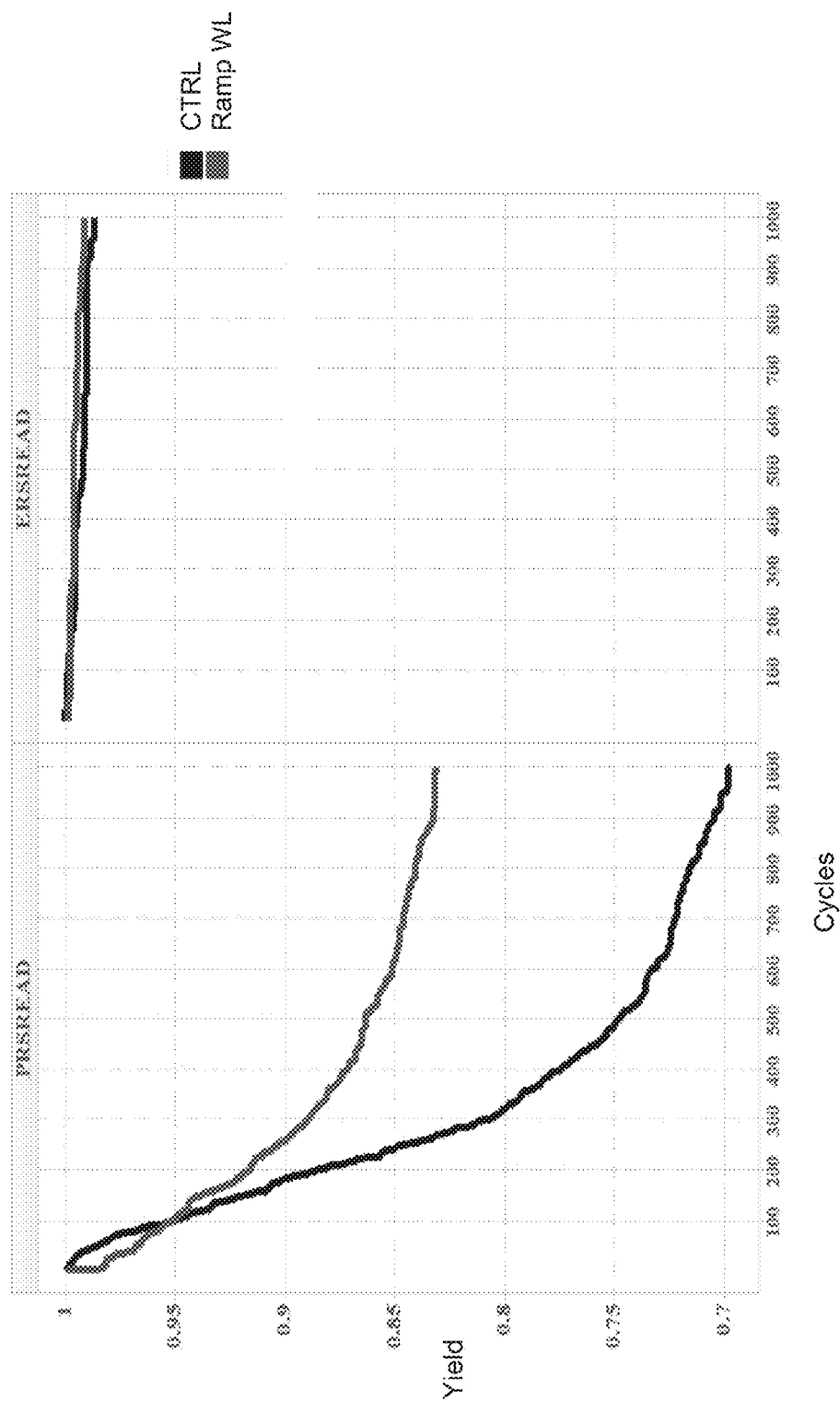
FIG. 30 shows results like those of FIG. 29, but for a greater number of cycles.

FIG. 30 shows results like those of FIG. 29, but for a greater number of cycles.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
a plurality of programmable impedance elements programmable between a low impedance state in response to a program voltage and a higher impedance state in response to an erase voltage that has a different polarity than the program voltage;
a programming circuit configured to apply the program and erase voltages to selected elements; and
a pre-condition path configured to apply a pre-condition voltage only of the erase voltage polarity to fresh elements in a pre-condition operation; wherein
fresh elements are elements that have not been subject to any programming voltages.

2. The memory device of claim 1, wherein:
at least some of the elements are in the low impedance state after the pre-condition operation.

3. The memory device of claim 1, wherein:
the pre-condition path is configured to apply a pre-condition voltage having a different magnitude than the erase voltage.

4. The memory device of claim 1, wherein:
the pre-condition path is configured to apply a pre-condition current through an element having a magnitude different than currents applied to an element when it is programmed to the low or higher impedance states.

5. The memory device of claim 4, wherein:
the pre-condition path is configured to apply a pre-condition current through an element that is less than a current applied to an element when it is programmed to the low or high impedance states.

6. The memory device of claim 1, wherein:
the pre-condition path is configured to apply a pre-condition current of no more than 100 uA.

7. The memory device of claim 1, wherein:
the erase voltage has a magnitude of no more than 1 volt.

8. The memory device of claim 1, wherein:
the pre-condition path is configured to apply a pre-condition voltage that ramps from a lower start voltage to a higher end voltage.

9. The memory device of claim 1, wherein:
the pre-condition path is configured to apply a pre-condition voltage that ramps from a higher start voltage to a lower end voltage.

10. The memory device of claim 1, further including:
a plurality of memory cells arranged into at least one array, each memory cell including at least one element and an access device that couples the element to a bit line, the access devices of a same row being coupled to a same word line; and
a word line driver circuit coupled to each word line, each word line driver circuit configured to apply a ramping voltage to its corresponding word line.

11. The memory device of claim 1, wherein:
each element comprises a solid ion conductor material disposed between two electrodes.

12. A memory device, comprising:
a plurality of programmable impedance elements;
circuits configured to apply program electrical conditions to place selected elements into a low impedance state, to apply erase electrical conditions to place selected elements into a higher impedance state, and to apply pre-condition electrical conditions to fresh elements in a pre-condition operation; wherein
fresh elements are elements that have never been subject to the program or erase electrical conditions, and the pre-condition electrical conditions are selected from the group of: low current high voltage (LCHV) conditions and high voltage high current (HVHC) conditions, wherein the LCHV conditions apply a lower current and a higher magnitude voltage to elements than the program or erase electrical conditions, and the HVHC conditions apply a higher magnitude voltage and higher current to elements than the program or erase electrical conditions.

13. The memory device of claim 12, wherein:
the pre-condition and erase electrical conditions apply a different polarity voltage across the elements as compared to the program electrical conditions.

14. The memory device of claim 12, wherein:
the pre-condition electrical conditions are the LCHV conditions; and
the circuits are configured to apply a pre-condition current of no more than 10 uA to elements.

15. The memory device of claim 12, wherein:
the circuits are configured to apply a pre-condition voltage having a different magnitude rate-of-change than voltages of the standard electrical programming conditions.

16. The memory device of claim 12, wherein:
the pre-condition electrical conditions are the HVHC conditions; and
the circuits are configured to apply a pre-condition voltage across elements of no less than 1.0 V.

17. The memory device of claim 12, further including:
a plurality of memory cells arranged into at least one array, each memory cell including at least one element and an access device that couples the element to a bit line, the access devices of a same row being coupled to a same word line; and
a word line driver circuit coupled to each word line.

18. The memory device of claim 17, wherein:
bit lines are pre-charged to a pre-condition voltage while word lines maintain access devices in an off state; and
the word line driver circuit is configured to drive a word line to a select voltage to enable an access device in a pre-condition operation; wherein
the pre-condition electrical conditions are created by the capacitive discharge of the bit line.

19. The memory device of claim 17, further including:
the word line driver circuit is configured to drive word lines to a standard voltage to read data from the elements and to drive word lines to a boost voltage in the pre-condition operation, the boost voltage having a greater magnitude than the standard voltage.

20. The memory device of claim 12, wherein:
each element comprises a solid ion conductor material disposed between two electrodes.

21. A method, comprising:
manufacturing a device that programs elements to a low impedance state with first electrical conditions, and programs elements to a higher impedance state with second electrical conditions having a different polarity than the first electrical conditions; and before programming any elements to the low or higher impedance states, pre-conditioning fresh elements with pre-condition electrical conditions different than at least the first electrical conditions; wherein the pre-condition electrical conditions include any selected from the group of: single polarity conditions that apply a voltage only of the same polarity as the second electrical conditions; high voltage low current (HVLC) conditions that apply a greater magnitude voltage and smaller current than the first or second electrical conditions; and (HVHC) conditions that apply a greater magnitude voltage and greater current than the first or second electrical conditions.

22. The method of claim 21, wherein:
the pre-condition electrical conditions are the HVLC conditions; and
the pre-conditioning of the fresh elements includes limiting a current flow through fresh elements to less than 10 uA.

23. The method of claim 21, wherein:
the pre-condition electrical conditions are the HVHC conditions; and
pre-conditioning electrical conditions include a voltage across fresh elements of no less than 1.0 volts.

24. The method of claim 21, wherein:
the pre-conditioning includes applying a ramped voltage to the elements selected from: a ramped voltage that increases over time, a ramped voltage that decreases over time, and a ramped voltage that increases and decreases over time.

25. The methods of claim 24, wherein:
applying the ramped voltage further includes
charging at least one bit line to a pre-condition voltage, and
turning on an access device of a memory cell to enable the bit line to discharge through an element.

26. The methods of claim 24, wherein:
applying the ramped voltage includes applying a ramped voltage to a control terminal of access devices coupled to the elements.

27. The methods of claim 21, wherein:
the pre-conditioning includes applying the pre-condition electrical conditions to a greater number of elements than a number of elements accessible when elements are programmed to the low impedance or higher impedance state.

28. The memory device of claim 21, wherein:
each element comprises a solid ion conductor material disposed between two electrodes.

* * * * *